United States Patent [19]

Worley et al.

[11] Patent Number: 5,440,162

[45] Date of Patent: Aug. 8, 1995

[54] ESD PROTECTION FOR SUBMICRON CMOS CIRCUITS

[75] Inventors: Eugene R. Worley, Irvine; Addison B. Jones, Yorba Linda; Rajiv Gupta, Brea, all of Calif.

[73] Assignee: Rockwell International Corporation, Seal Beach, Calif.

[21] Appl. No.: 280,417

[22] Filed: Jul. 26, 1994

[51] Int. Cl.$^6$ .......................... H01L 29/06; H02H 9/00
[52] U.S. Cl. ..................................... 257/355; 257/363; 257/499; 257/532; 257/536; 361/56; 361/91
[58] Field of Search ............... 257/355, 356, 363, 491, 257/499, 532, 536, 546; 361/56, 91

[56] References Cited

PUBLICATIONS

Electrical Overstress/Electrostatic Discharge Symposium Proceedings, 1993, Lake Buena Vista, Fla., Sep. 28–30, 1993, pp. 5B.5.1 through 5B.5.5.

Primary Examiner—Mark V. Prenty
Attorney, Agent, or Firm—H. Frederick Hamann; George A. Montanye; Philip K. Yu

[57] ABSTRACT

An ESD protection circuit for the pads of an integrated circuit (IC) using silicide-clad diffusions is disclosed. The circuit uses a robust N+ diode with N-well block, an output NFET and a large transient clamp, each with a distributed, integrated N-well drain resistor to prevent the IC from avalanching and leakage during the Human Body Model and Charged Device Model tests for ESD.

20 Claims, 8 Drawing Sheets

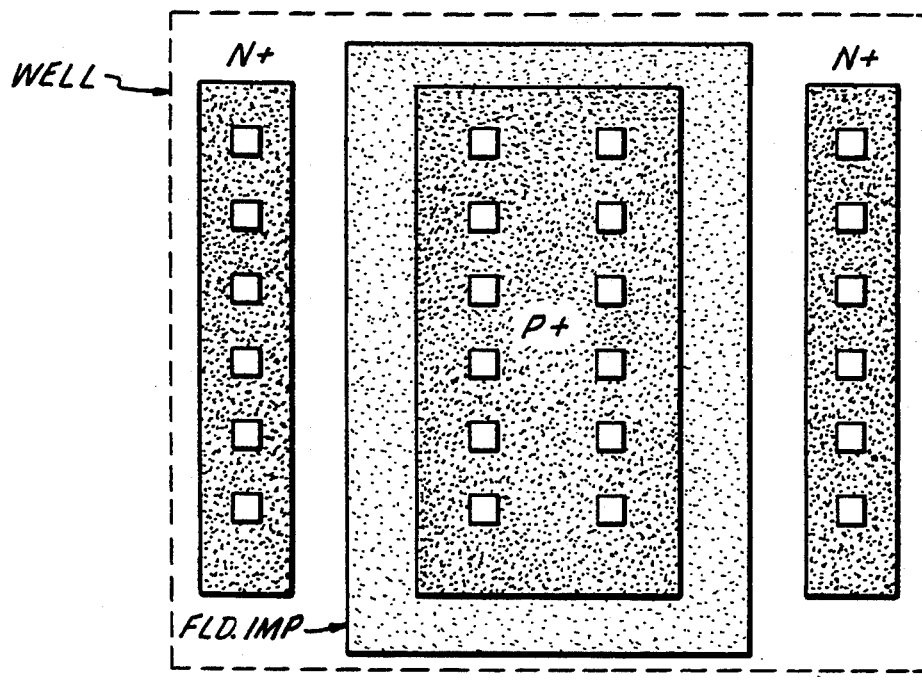
_Fig. 8._
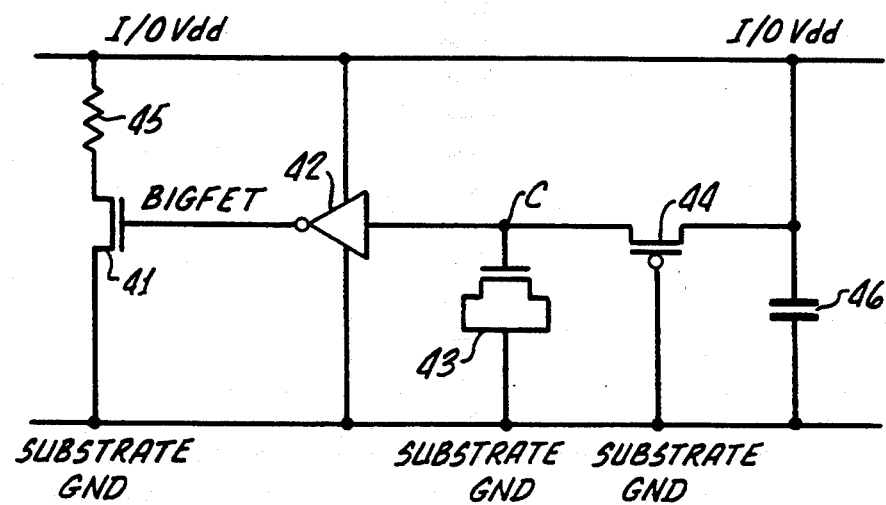
_Fig. 9._

ESD PROTECTION FOR SUBMICRON CMOS CIRCUITS

FIELD OF THE INVENTION

The present invention relates to electrostatic (ESD) protection devices for semiconductor circuit devices and more specifically to those with I/O MOSFETS having highly conductive source/drain regions.

ART BACKGROUND

Recent progress in VLSI technology has made integrated circuits with smaller and smaller geometries a reality. As the devices become more miniaturized, however, they become more susceptible to electrostatic discharge (ESD) damages. If not properly contained, ESD can destroy a device, lower reliability and eventually reflect in the bottomline of an electronic device manufacturer.

Protecting a device from the peril of ESD has been quite an endeavor for those skilled in the art. Integrated circuits nowadays are fabricated with many layers of thin film materials such as thermal oxides, dielectric layers, polycrystalline silicon and metal films. The addition of each layer complicates the problem. An example can be found in the forming of metal films using a process where the top layers of both poly-silicon and diffusion regions are deposited and fused with a material such as Ti to form silicides such as TiSi2 for improved sheet conductivity.

This process has been particularly prone to ESD problems. The silicided region of a diffusion comes close to shorting out junctions because of close proximity to the junction. With the improved conductivity, i.e. lower sheet resistance, a contact pad can short with the channel of a MOSFET ("metal-oxide semiconductor field-effect transistor") even if the pad is placed further away than normal. Worse yet, there often exist "silicide asperities" along the diffusion perimeter, where the distance between the silicide and junction varies. When the silicide is too close to the junction, leakage occurs. Further, field implant may cause an N+/substrate junction to avalanche at the top perimeter due to the lower avalanche breakdown voltage at the semiconductor surface than at the junction area below the surface. The avalanche current of this junction may occur right at the point where the silicide is closest to the junction, thus causing leakage or shorts by migrating the silicide into the junction. FIGS. 1 illustrates the cross-sectional view of a typical silicided region with FIG. 2 showing silicide asperities occurring around the perimeter of the N+ region.

To minimize the effect of ESD, protection devices have been constructed for the input and output pads of a device for the purpose of absorbing the sudden surge of ESD. Two commonly used methods of testing a device's ESD tolerance are the Human Body Model (HBM) and the Charged Device Model (CDM). HBM involves simulating the discharge which can occur when an individual touches a device; that is, the human body can be represented by a capacitor of 100 pF charged to a specified voltage and then discharged into the device through a 1500 Ohm resistor. CDM simulates a charged device contacting a metal grounded surface typically associated with automated handling equipment.

Conventional ESD protection structures, which include field snap-back (FSB) transistors, NFET's and N+/substrate diodes, have been found to be ineffective because weak spots are located at random from die to die. Also methods such as increasing NFET channel length, increasing contact-to-channel spacing, adding ESD implant, etc., have been marginal in eliminating rogue pins. Use of a "silicide-block" layer to eliminate problems related to the silicide layer on the I/O sources/drains adds cost to the process.

Therefore, it is desirable to provide ESD protection for devices of small geometries by preventing junctions from avalanching during an ESD discharge. It is also desirable to be able to sink or source the ESD current when it does occur. It is desirable to be able to provide a ballast to minimize damage from avalanching and snap-back and to limit the pad voltage by discharging from pad to Vss. Finally, for fully robust parts, it will be desirable to be able to accommodate the test conditions for both HBM and CDM.

SUMMARY OF THE INVENTION

An ESD protection circuit for the pads of an integrated circuit (IC) is disclosed. The ESD protection circuit comprises a first robust N+ diode coupled between one of the contact pads and a substrate ground, a first P+ diode coupled between the contact pad and a first Vdd, a first NFET coupled to the first Vss and the contact pad, a first distributed, integrated N-well resistor coupled between the drain terminal of the first NFET and the contact pad, a PFET coupled to the first Vdd and the contact pad, a resistor coupled between the contact pad and the receiver NFET, a second robust N+ diode for input protection coupled locally between the receiver Vss and the gate of the receiver NFET, a second P+ diode coupled locally between the receiver Vdd and the gate of the receiver NFET, a clamp between first Vdd and first Vss for clamping the voltage at the contact pads to less than a predetermined breakdown voltage of the junctions at a predetermined current level with the clamp being distributed around the I/O power supply ring of the IC, and a capacitor coupled in-parallel with the clamp with the capacitor having a predetermined fast risetime for ground bounce protection.

BRIEF DESCRIPTION OF THE DRAWING

Further objects, features and advantages of the present invention will become apparent in the following description, wherein:

FIG. 8 illustrates a typical layout diagram of the robust P+ diode.

FIG. 9 is the schematic diagram of the Vdd-Vss clamp incorporated in the present invention.

DETAILED DESCRIPTION OF THE DRAWINGS

An ESD protection device for the pads of an integrated circuit ("IC") is disclosed. While the following description makes reference to semiconductor materials of a certain type, e.g. N- or P-type, those skilled in the art would appreciate that equivalent materials of other types may readily be utilized to achieve the same intended objectives.

Figure 3:
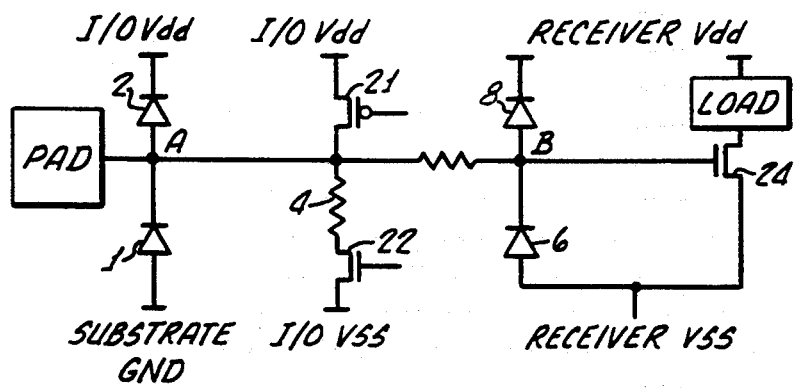
FIGS. 3 and 4 show the schematic diagram of a pad with ESD protection devices.

Referring to FIG. 3, the schematic diagram of a pad with an ESD protection circuit in accordance with the present invention is illustrated. An N+/substrate diode 1 is connected between substrate ground and node A, where a pad is connected. A generally low-resistance P+/N-well diode 2 is connected between node A and I/O Vdd. Also connected to node A is the source terminal of a PFET 21. A distributed, integrated N-well resistor 4 is connected between node A and the drain terminal of an NFET 22. The source terminal of the NFET 22 is connected to I/O Vss. A resistor 5 is connected between node A and node B. The resistor 5, for input protection purposes, may also be a well resistor. A diode 6 is locally connected between node B and the receiver Vss, where the diode 6 is a robust N+/P diode. A diode 8 is locally connected between node B and the receiver Vdd, where the diode 8 is a P+/N-well diode.

The NFET 22 and PFET 21 are output driver transistors, and the diodes 6 and 8 are secondary local clamps for the input transistor 24.

Those skilled in the art will recognize that while there are currently two power supplies described, i.e. an I/O Vdd/Vss and a receiver Vdd/Vss, the separate Vdd/Vss acts to reduce noise due to ground bounce. It will also be recognized that the receiver Vdd/Vss is connected to the I/O Vdd/Vss externally. In certain instances, the receiver Vdd/Vss are not even needed and a single I/O Vdd/Vss will suffice for the chip.

For certain IC's, all that may be required for ESD protection on any of the pads are some sufficiently large diodes to sink the high current density suddenly occurring at some pads of the device, provided that the entire circuit is large and operates from only one power source. However, to further guard an IC against ESD damage, FIG. 4 will illustrate additional circuits that may be implemented in connection with the circuit described in FIG. 3.

Figure 4:
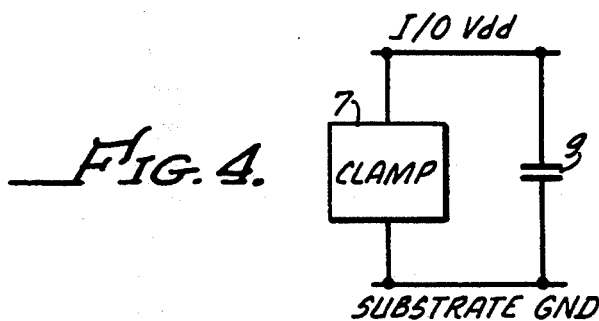

Referring to FIG. 4, a transient clamp 7 is connected between the I/O Vdd and substrate ground, whereas the clamp 7 may be a large field-effect transistor (FET) as will be appreciated by those skilled in the art. A relatively fast capacitor 9 is connected between the I/O Vdd and substrate ground. Since the CDM test involves relatively low chip substrate-to-ground plate capacitance, typically on the order of 10 pF, it may be practical to use the on-chip capacitor 9 to help attenuate the voltage that appears across the Vdd/substrate nodes during a CDM transient.

Currently, it would be desirable to have a fast capacitor which can experience a CDM pulse risetime no slower than 400 pS for CDM pulses. Note that the HBM model uses a capacitance of about 100 pF, which may be too high for this capacitor to provide an effective attenuation. The capacitor 9 may also be designed to have a small parasitic series resistance such that the RC time constant is no more than 100 pS.

Figure 5:
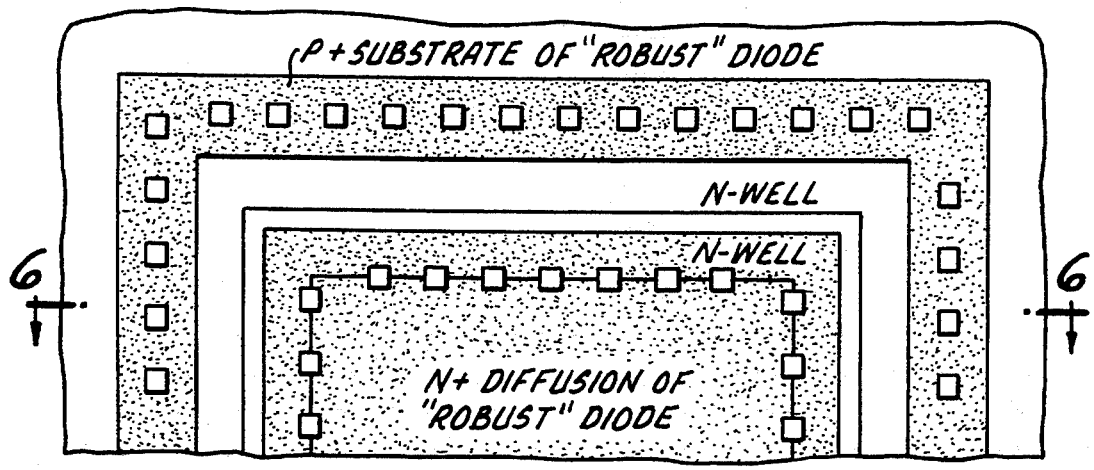
FIG. 5 is a typical layout diagram of the robust N+ diode.
Figure 6:
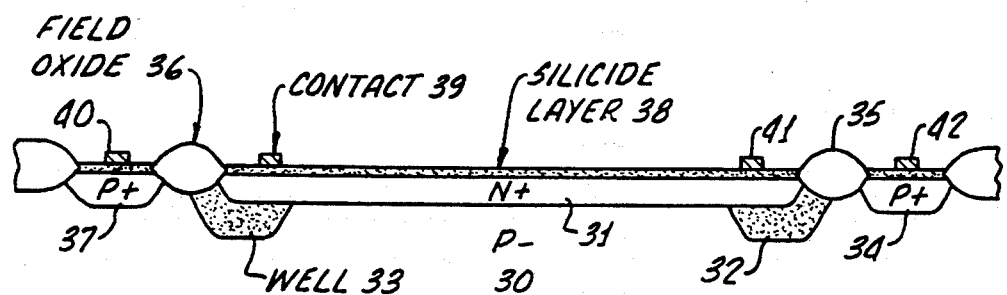
FIG. 6 illustrates the cross-sectional view of the robust N+ diode.

Reference is to FIGS. 5 and 6, where a representative layout diagram of the robust N+/substrate diode and its cross-sectional view are illustrated, respectively. Because of the current handling capability of diodes In forward-biased direction and their weakness in reverse or avalanche mode, the N+/substrate diode 1 (FIG. 3) may be made robust to avoid damage due to avalanche and to utilize its forward-biased junction to conduct the ESD current from the pad to prevent the P+/N-well diode junctions from entering into avalanche mode. A diode could be made "robust" by having a well enclosing the perimeter of the N+/substrate diode. The well acts to prevent the junction from breaking down at the edge at relatively low positive voltage applied to the pad. As will be appreciated by those skilled in the art, without the well, the junction edge will tend to break down at about 17 volts, whereas the well would enable the junction edge to not-avalanche until 40 volts or more. As a result, during a modest ESD discharge the pad voltage will be less likely to reach the avalanche point of the junction edge.

Figure 10:
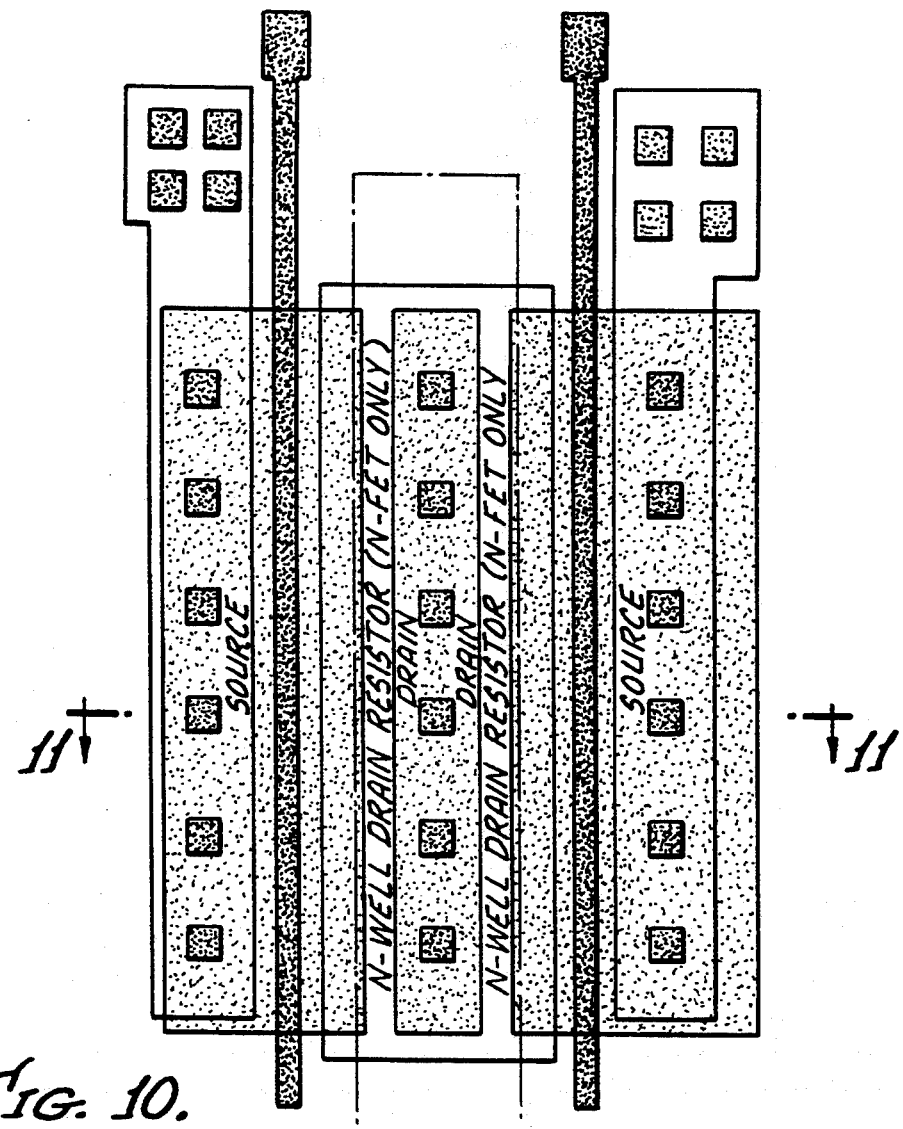
FIG. 10 is a typical layout diagram of the BIGFET.
Figure 11:
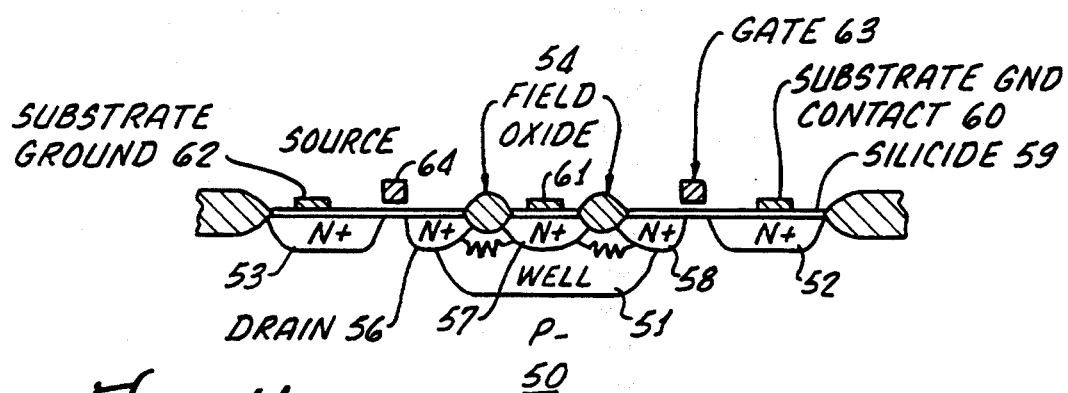
FIG. 11 illustrates the cross-sectional view of a currently implemented BIGFET Vdd-Vss clamp with a distributed, integrated N-well drain resistor in the ESD protection circuit according to the present invention.

While surrounding the N+/substrate perimeter of the diode 1 connected to the pad with a well can prevent avalanche, the drain terminal of the NFET driver 22 (FIG. 3) typically cannot be surrounded on the gate side because of the adverse impact to its operation. As a result a distributed, integrated well resistor 4 is implemented to, at least, limit the current that can flow into the unprotected diode edge of the NFET driver 22. The N-well resistor 4, which is distributed to effectively buffer the ESD current spike, can act as a ballast to the current flowing into the NFET driver 22 during a snap-back mode. Without the N-well resistor 4, a high current will tend to flow into the localized regions while the NFET driver 22 is in the snap-back mode. The local current flow will ultimately cause a second breakdown and a short for the circuit. The distributed, integrated well resistor acts to reduce the current flow through the NFET driver and to make the current flow more uniform during an ESD event. The layout diagram in FIG. 10 shows one method of achieving an NFET driver with a distributed, integrated N-well resistor, and the cross-section in FIG. 11 shows how the distributed, integrated N-well resistor is formed.

Reference is to FIG. 6. The substrate 30 is made from a typical "P−" semiconductor material. An N+ region 31 is formed above the P− substrate 30. The N+ region 31 is spaced from the P+ regions 34, 37 by field oxide 35, 36. A silicide layer 38 applied to the N+ 31 and P+ 37 regions provides higher sheet conductance. Contacts 39-42 are formed on the silicide layer 38 to provide cathode and anode terminals for the robust diode. N-well regions 32, 33 are formed to surround the perimeter of the N+ layer 31 and the area joining with field oxide 35, 36. As a result, the areas most vulnerable to avalanche during ESD are thus "robustified." The remaining planar N+/substrate junction provides a low resistance diode to short ESD current to the substrate when forward biased. This is particularly effective when a P− on P+ EPI substrate is used, allowing the current from the forward-biased robust diode to flow directly to the grounded P+ substrate.

Currently, the distance between the top of the silicide layer 38 and the bottom of the N-well 32, 33 is about 2 um. The thickness between the top of silicide layer 38 and the bottom of the N+ layer 31 is about 0.2 um. Those skilled in the art, however, should be able to determine their own specification according to the structure required.

Figure 1:
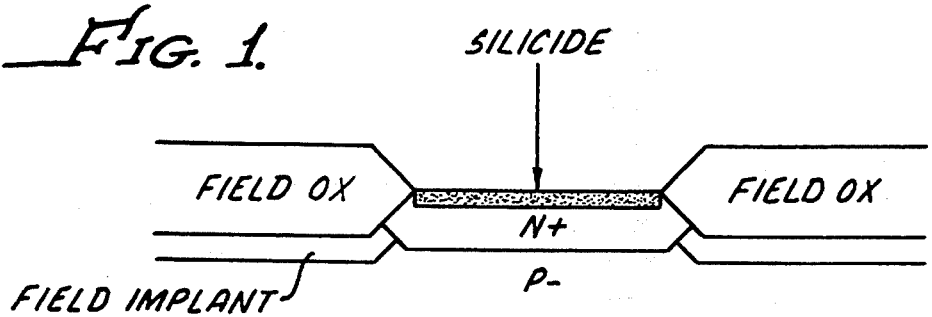
FIG. 1 illustrates the cross-sectional view of a typical silicided diffusion.
Figure 2:
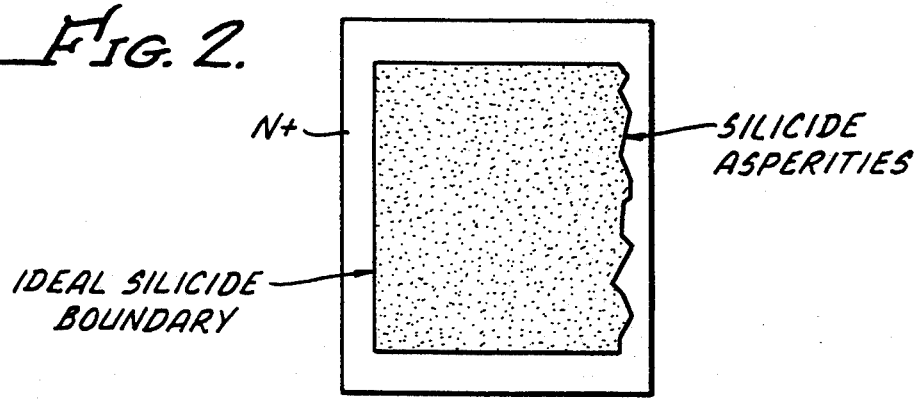
FIG. 2 shows silicide asperities occurring around the perimeter of the N+ region.
Figure 7:
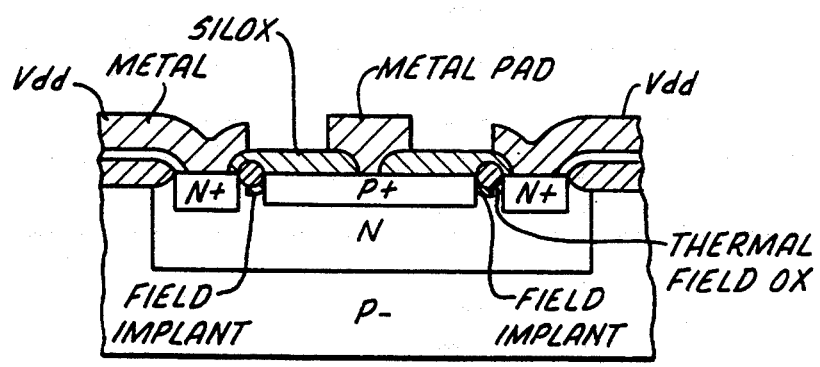
FIG. 7 illustrates the cross-sectional view of the robust P+ diode.

Note that the P+/N-well diode (2, FIG. 1) may also be robustified by using an underlying field implant method as shown in FIG. 7. With the field implant around the edges of the P+ diffusion region the P+/N-well breakdown voltage at the field oxide interface will be increased. The spacing from P+ to N+ in this diode must be increased to avoid a low voltage breakdown between the P-type field implant and the N+ region. A representative layout diagram of the robust P+ diode is shown in FIG. 8. Note that the field implant surrounds the edges of the P+ region, but does not reach the N+ region.

Reference is to FIG. 9, where the schematic diagram of the clamp (7, FIG. 4) is further described. The "BIGFET" 41 is an NFET implemented with an integrated, distributed N-well drain resistor 45 connected to the I/O Vdd. An inverter 42 with its output applied to the gate of BIGFET 41 acts as a level sensor. A gate-oxide capacitor 43 is connected between node C and substrate ground. One terminal of the PFET 44 is connected to node C, while the other terminal is connected to the I/O Vdd. The gate of the PFET 44 is connected to substrate ground. A Vdd capacitor 46 is connected between the I/O Vdd and substrate ground. This capacitor may provide additional protection during CDM testing, which involves very rapid, high current voltage spikes.

The "BIGFET" 41, as a large transient clamp, acts to significantly improve the HBM performance of the IC. Currently, the size of the BIGFET 41 is implemented at 800 um by 0.8 um, width by length, with a minimum of 10 BIGFET's being distributed around the I/O power ring. To protect the BIGFET 41 during the CDM test, a distributed, integrated drain resistor 45 may be added to the BIGFET 41.

It should be noted that the BIGFET 41 may be constructed by those skilled in the art in accordance with the specification required during an ESD situation, i.e. during high current transients. For example, the BIGFET 41 should be able to withstand a current of about 1.7 Amp when the ESD voltage is about 2.5K-volts, with a drain voltage not greater than 6 volts.

FIG. 10 illustrates a representative layout diagram of BIGFET and FIG. 11 illustrates a representative cross-sectional view of a currently implemented BIGFET with a drain resistor in the ESD protection circuit in accordance with the present invention. This layout and cross-section are also representative of output NFET's implemented in accordance with the present invention. The substrate 50 is made of P− or P−-on-P+ epitaxial semiconductor material. A silicide layer 59 is applied to the diffusion regions of the device for improved sheet conductance. Sources 52, 53 and gate terminals 63, 64 and drains 56 and 58 form parallel NFET's. Source regions 52, 53 are formed by N+ material, and drains 56 and 58 and drain contact region 57 are also formed by N+ material. Note that contacts 60, 62 are for ground or Vss and drain contact 61 is for Vdd (in the case of BIGFET) or for the pad connection (in the case of the NFET output driver.) Well 51 is formed by N-type material within substrate P− and underneath drain contact region 57. As shown in FIG. 11, drain resistor contacts are formed by the N+ regions 56, 57, and 58 within the N-well 51 which forms the integrated, distributed well resistor underneath field oxide regions 54. Note that the drain resistors thus formed should be distributed so as to prevent the formation of any hot spots during an ESD surge.

While the BIGFET is currently shown as two in-parallel NFET's for compactness reasons, it would be apparent to those skilled in the art that other arrangements may also be available for their intended functionality.

A note should be made with respect to the design rationale of BIGFETs as they are applied to the return path of positive ESD pulses. For ESD discharges, there must be a current return path provided for the ESD current. The current direction that typically presents the most trouble for ESD design is the direction in which current is flowing into the pad, i.e. during a positive HBM discharge.

Figure 12:
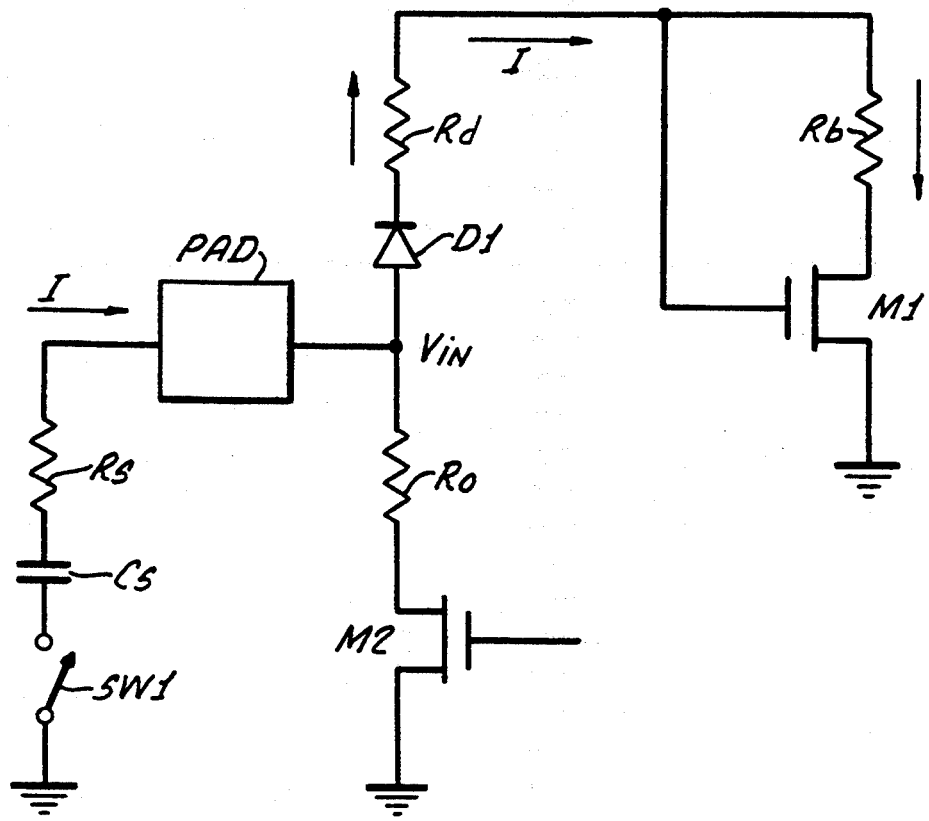
FIG. 12 illustrates the schematic diagram of HBM model and input circuit.

Referring to FIG. 12, a typical current return path of a CMOS chip using a large pad diode and Vdd-Vss BIGFET clamp is shown. Cs, Rs and SN1 represent a simplified version of the HBM discharge circuit. D1 Is the pad P+/Nell diode (and/or the PFET output driver P+/N-well drain diode). Rd is the diode equivalent resistance plus the power bus resistance. M1 is the BIGFET clamp transistor. Rb is the BIGFET drain resistor. M2 is the NFET output driver. Rb is the output driver drain well resister. First, the design objective is thus to prevent Vin, the pad voltage, from exceeding the breakdown voltage of M2. For some salicided junction areas, exposure even to a mild breakdown condition will cause leakage, even with a series drain well-resister in place. Therefore, during the discharge, Vin must be kept less than the BVdss of M2. The peak current flowing into the pad is Ipeak=Vc/Rs, where Vc is the initial voltage on the HBM capacitor and Rs is the HBM source resistance. The above equation assumes that Vin is much smaller than Vc during the discharge. Thus the overall design objective is to keep the voltage drop across D1, Rd, Rb and M1 less than the BVdss of M2 for a current of Ipeak.

Typically, the voltage drop across the diode junction is 0.75 V, the diode series resistance is about 2 ohms, and the bus resistance about 1 ohm. The design variable is the width of the BIGFET including the built-in drain well-resistor, Rb. The width of M1 may be established using a circuit simulator such a SPICE, as will be appreciated by those skilled in the art.

Figure 13:
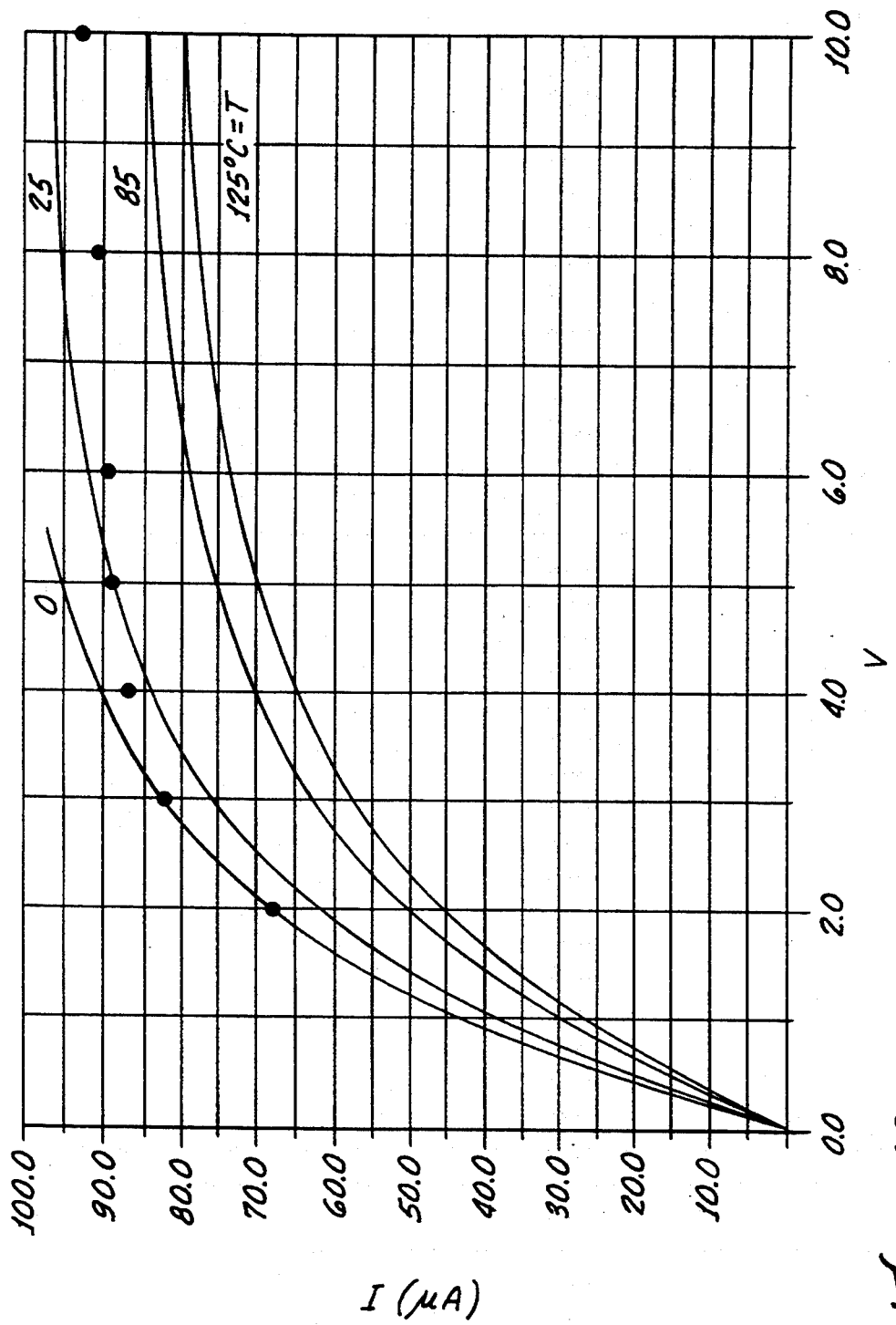
FIG. 13 shows the IV characteristics of a well resistor at different temperatures.

FIG. 13 shows the IV characteristics of a well resistor at different temperatures. The data points correspond to data generated by the SPICE JFET model, which reproduced the measured data to within a few percent at temperature equals 25° C. The saturation characteristic of the N-well resistor may be attributed to velocity saturation. This characteristic is ideal since it provides current limiting when placed in series with the drain of an NFET exposed to ESD current surges. The saturation voltage may be determined by the length of the resistor and was set to about 5 V. Thus, during normal 5 V output driver operation, a properly designed integrated, distributed N-well resistor will not seriously reduce the drive, but for ESD-induced avalanche, the current flow will be limited.

Figure 14:
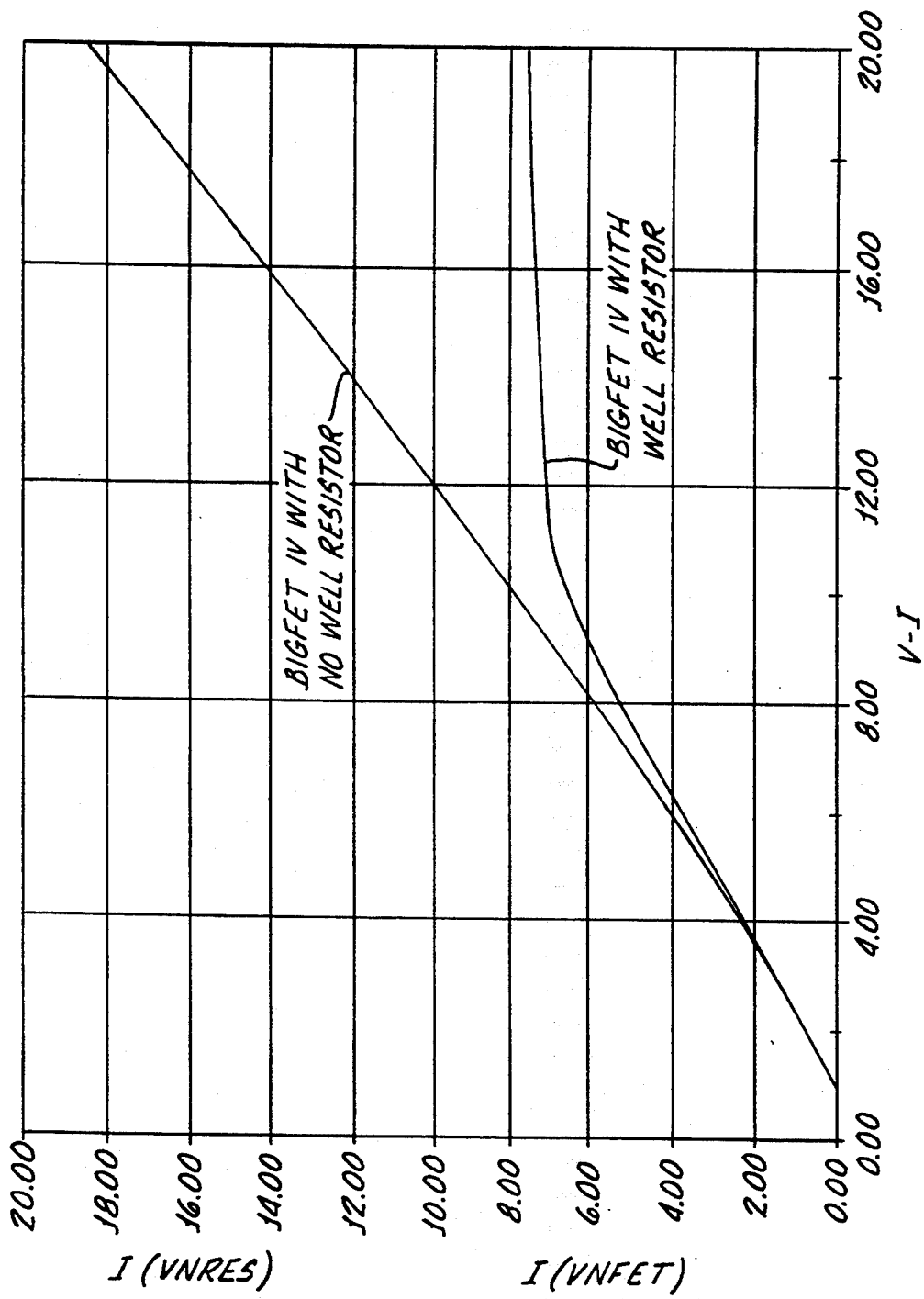
FIG. 14 shows the IV characteristics with Vgs=Vds of the BIGFET with and without the distributed, integrated N-well drain resistor.

FIG. 14 shows the IV characteristics (@Vgs=Vds) of the BIGFET with and without the well drain resistor. As can be seen from the curve, for values of voltages at or below 6 volts, the well resistor reduces the current by only a few percent. The well resistor thus has a negligible effect on the HBM performance, which requires the BIGFET to restrict Vdd to about 6 volts. At about 10 volts, the saturation characteristic of the well resistor is entered and the drain current of BIG-FET saturates at about 1 mA/um. Without the resistor, the current is observed to continue to rise.

Figure 15:
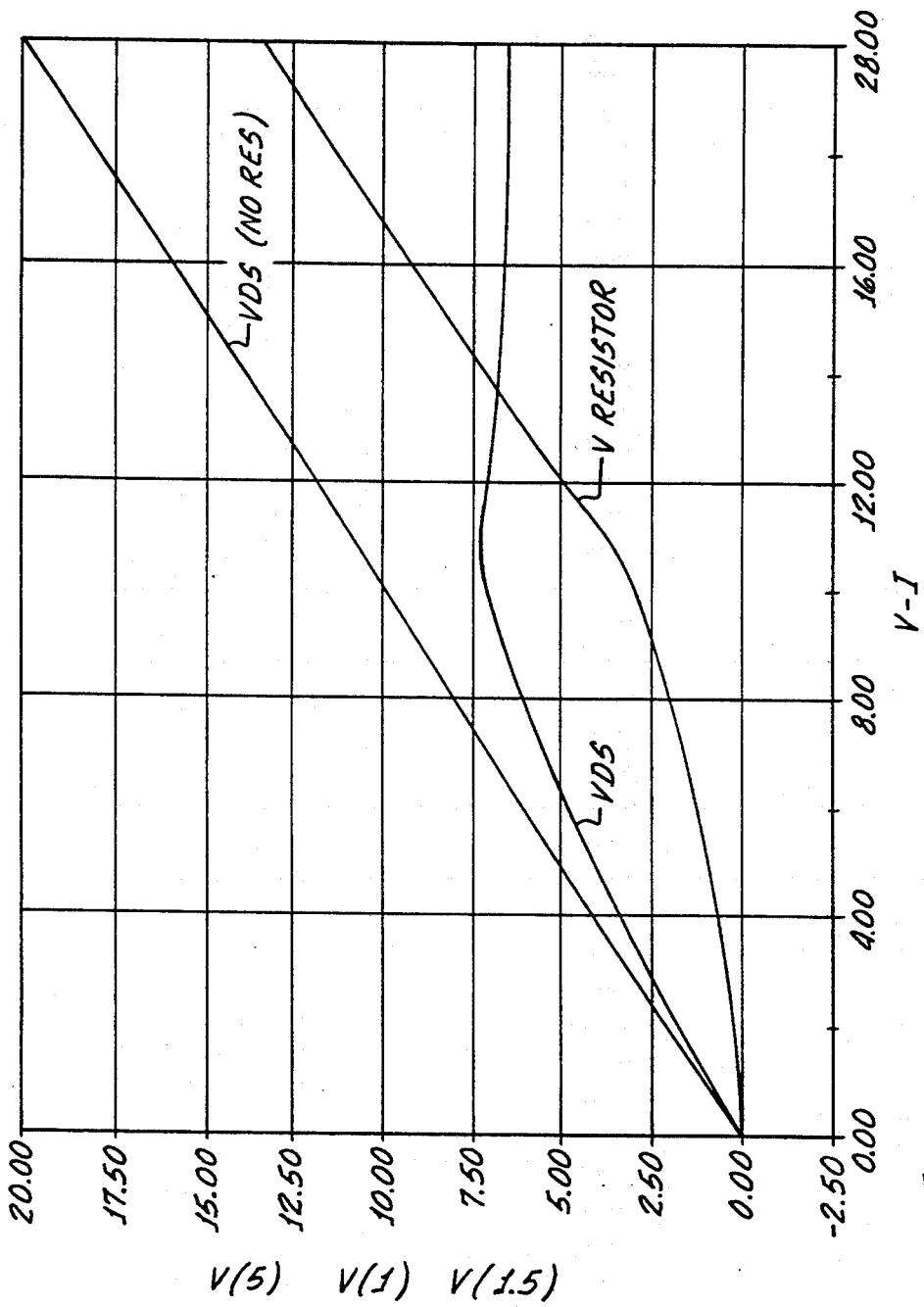
FIG. 15 shows the various voltage levels as they appear in the devices simulated in FIG. 13.

FIG. 15 shows the various voltage levels as they appear in simulations of the devices in FIG. 3 Note that with the integrated distributed N-well/NFET resistor, Vds is limited to 7.5 volts which is well below 12 volt—a point where a snapback is generated. Therefore, the NFET driver 22 appears less likely go into a snapback mode even with 20 volts appearing on the pad. The maximum voltage on the well resistor is about 13 volts with 20 volts on the pad. The well resistor has been observed to avalanche at about 16 volts. Thus, even the extreme voltage of 20 volts on Vdd is insufficient to cause avalanche in BIGFET or its integrated distributed N-well resistor. As a result, adding the integrated, distributed N-well resistor to BIGFET causes negligible degradation of the HBM performance, while preventing BIGFET from avalanching and limiting BIGFET's current and voltage during a CDM event.

What is claimed is:

1. An ESD protection circuit for an integrated circuit ("IC") employing silicide-clad N+ and P+ regions having a plurality of contact pads, said IC being coupled to first Vdd and first Vss, and substrate ground, comprising:
   a first N+ diode whose cathode is coupled to one of the contact pads forming a first node and whose anode is coupled to said substrate ground, said first diode comprising:
   a substrate of one of P⁻-type and P⁻-on-P+ epitaxial type;
   N+ regions disposed over said substrate to form a diode;
   P+ regions disposed over said substrate and connected to substrate ground;
   field oxide regions formed to electrically insulate said N+ regions from said P+ regions;
   N-well formed within said substrate enclosing the perimeter of said N+ regions, such that the first robust diode is prevented from avalanching below a predetermined voltage level applied to said pad.

2. An ESD protection circuit according to claim 1, further comprising a P+ diode whose anode is coupled to said contact pad and whose cathode is coupled to said first Vdd.

3. An ESD protection circuit according to claim 1, further comprising a robust P+ diode whose anode is coupled to one of said contact pads and whose cathode is coupled to said first Vdd, said robust P+ diode comprising:
   P+ regions disposed in an N-well to form a diode;
   N+ regions disposed in said N-well;
   field oxide regions formed to insulate the P+ regions from said N+ regions,
   field implant formed to surround the perimeter of the P+ regions.

4. An ESD protection circuit according to claim 1, further comprising:
   a first NFET whose source is coupled to said first Vss;
   a first distributed, integrated resistor coupled between the drain terminal of said first NFET and said contact pad, said resistor being formed by a lightly doped well of the same type polarity as the drain of said first NFET.

5. An ESD protection circuit according to claim 4, further comprising:
   a second NFET whose drain is coupled to said first Vdd;
   a second distributed, integrated well resistor coupled between the source terminal of said second NFET and said contact pad, said resistor being formed by a well of the same type polarity as the source of said second NFET.

6. An ESD protection circuit according to claim 4, further comprising:
   a PFET whose source is coupled to said first Vdd, and whose drain is coupled to said contact pad.

7. An ESD protection circuit according to claim 6, further comprising:
   a resistor coupled between said contact pad and a second node;
   a second N+ diode for input protection whose anode is locally coupled to a second Vss and whose cathode is locally connected to said second node, said second N+ diode comprising:
   an substrate of one of P⁻-type and P⁻-on-P+ epitaxial type;
   N+ regions disposed over said substrate to form a diode;
   P+ regions disposed over said substrate and connected to substrate ground;
   field oxide regions formed to electrically insulate said N+ regions from said P+ regions;
   N-well formed within said substrate enclosing the perimeter of said N+ regions, such that the first robust diode is prevented from avalanching below a predetermined voltage level applied to said pad;
   a P+ diode for input protection whose cathode is locally connected to a second Vdd and whose anode is locally connected to said second node.

8. An ESD protection circuit for an integrated circuit ("IC") employing silicide-clad N+ and P+ regions having a plurality of contact pads, said IC being coupled to Vdd and Vss and substrate ground, comprising a clamp for clamping the voltage at one of the contact pads to less than a predetermined pn junction breakdown voltage at a predetermined current level, said clamp being distributed around said Vdd and Vss, said clamp comprising:
   an NFET having its source terminal coupled to the substrate ground and its drain to said Vdd;
   an inverter having its output terminal coupled to the gate of said NFET;
   a first capacitor coupled between the input of said inverter and the substrate ground;
   a PFET having its drain coupled to the input of said inverter, its source to the first Vdd and its gate to the substrate ground.

9. An ESD protection circuit according to claim 8, wherein said NFET is coupled to said Vdd through a distributed, integrated resistor formed between its drain terminal and the Vdd, said resistor being formed by a lightly-doped well of the same type polarity as the drain of said NFET.

10. An ESD protection circuit according to claim 9, further comprising a second capacitor coupled between said Vdd and Vss in-parallel with the clamp, said second capacitor having a predetermined fast risetime for ground bounce protection.

11. An ESD protection circuit according to claim 10, wherein the time constant for the second capacitor is less than 100 pico-seconds.

12. An ESD protection circuit for an integrated circuit ("IC") employing silicide-clad N+ and P+ regions having a plurality of contact pads, said IC being coupled to Vdd and Vss, and substrate ground, comprising:
   a first NFET whose source is coupled to said Vss;
   a first distributed, integrated N-well resistor coupled between the drain terminal of said first NFET and one of said contact pads.

13. An ESD protection circuit according to claim 12, further comprising:
   a second NFET whose drain is coupled to said Vdd;
   a second distributed, integrated N-well resistor coupled between the source terminal of said second NFET and one of said contact pads.

14. An ESD protection circuit according to claim 12, further comprising:
   a PFET whose source is coupled to said Vdd and whose drain is coupled to one of said contact pads.

15. An ESD protection circuit according to claim 1, further comprising a clamp for clamping the voltage at one of the contact pads to less than a predetermined pn junction breakdown voltage at a predetermined current level, said clamp being distributed around an I/O power supply ring of the IC, said clamp comprising:
   an NFET having its output terminal coupled to the gate of said NFET;
   an inverter having its output terminal coupled to the gate of said NFET;
   a first capacitor coupled between the input of said inverter and the substrate ground;
   a PFET having its drain coupled to the input of said inverter, its source coupled to the first Vdd and its gate coupled to the substrate ground.

16. An ESD protection circuit according to claim 15, wherein said NFET is coupled to said first Vdd through a distributed, integrated N-well resistor formed between its drain terminal and the first Vdd.

17. An ESD protection circuit according to claim 16, further comprising a second capacitor coupled in-parallel with the clamp, said second capacitor having a predetermined fast risetime for CDM protection.

18. An ESD protection circuit according to claim 17, wherein the time constant for the second capacitor is less than 100 pico-seconds.

19. An ESD protection circuit for an integrated circuit ("IC") employing silicide-clad N+ and P+ regions having a plurality of contact pads said IC being coupled to first Vdd and Vss and substrate ground, comprising:
   a first N+ substrate diode whose cathode is coupled to one of the contact pads forming a first node and whose anode is coupled to said substrate ground, said first N+ diode comprising:
      an substrate of one of P--type and P--on-P+ epitaxial type;
      N+ regions disposed over said substrate to form a diode;
      P+ regions disposed over said substrate and connected to substrate ground;
      field oxide regions formed to electrically insulate said N+ regions from said P+ regions;
      N-well formed within said substrate enclosing the perimeter of said N+ regions, such that the first N+ diode is prevented from avalanching below a predetermined voltage level applied to said pad;
   P+ well diode whose anode is coupled to said contact pad and whose cathode is coupled to said first Vdd;
   a first NFET whose source is coupled to said first Vss;
   a first distributed, integrated N-well resistor coupled between the drain terminal of said first NFET and said contact pad;
   a PFET whose source is coupled to said first Vdd and whose drain is coupled to one of said contact pads;
   a resistor coupled between one of said contact pads and a second node;
   a second N+ substrate diode whose anode is locally coupled to a second Vss and whose cathode is locally connected to said second node, said first N+ diode comprising:
      an substrate of one of P--type and P--on-P+ epitaxial type;
      N+ regions disposed over said substrate to form a diode;
      P+ regions disposed over said substrate and connected to substrate ground;
      field oxide regions formed to electrically insulate said N+ regions from said P+ regions;
      N-well formed within said substrate enclosing the perimeter of said N+ regions, such that the second N+ diode is prevented from avalanching below a predetermined voltage level applied to said pad;
   a second P+ well diode whose cathode is locally coupled to a second Vdd and whose anode is locally connected to said second node;
   a clamp for clamping the voltage at one of the contact pads to less than a predetermined pn junction breakdown voltage at a predetermined current level, said clamp being distributed around the I/O power supply ring of the IC;
   a capacitor coupled in-parallel with the clamp, said capacitor having a predetermined fast time constant for CDM protection.

20. An ESD protection circuit according to claim 19, wherein:
   said first robust N+ substrate diode comprises:
      a substrate of one of P--type and P--on-P+ epitaxial type;
      N+ regions disposed over said substrate to form a diode;
      P+ regions disposed over said substrate and connected to substrate ground;
      field oxide regions formed to electrically insulate said N+ regions from said P+ regions;
      N-well formed within said substrate surrounding the perimeter of said N+ regions, such that the first robust diode is prevented from avalanching below a predetermined voltage level applied to said pad;
   said P+ well diode is a robust P+ diode comprising:
      P+ regions disposed in an N-well to form a diode;
      field oxide regions formed to insulate the P+ regions;
      field implant formed to enclose the perimeter of the P+ regions;
   and said clamp comprises:

an NFET having its source terminal coupled to the substrate ground and its drain terminal coupled to said first Vdd through a distributed, integrated N-well resistor, an inverter having its output terminal coupled to the gate of said NFET;

a capacitor coupled between the input of said inverter and the substrate ground;

a PFET having its drain coupled to the input of said inverter, its source coupled to the first Vdd and its gate coupled to the substrate ground.

* * * * *